(12) United States Patent
Molson et al.

(10) Patent No.: US 6,634,009 B1
(45) Date of Patent: Oct. 14, 2003

(54) INTERLEAVER-DEINTERLEAVER MEGACORE

(75) Inventors: Philippe Molson, San Jose, CA (US); Tony San, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 384 days.

(21) Appl. No.: 09/653,528

(22) Filed: Aug. 31, 2000

Related U.S. Application Data
(60) Provisional application No. 60/187,872, filed on Mar. 8, 2000.

(51) Int. Cl.[7] ............................................... G06F 17/50
(52) U.S. Cl. .......................................... 716/1; 714/702
(58) Field of Search .............................. 716/1; 714/702

(56) References Cited

U.S. PATENT DOCUMENTS

| | | | | |
|---|---|---|---|---|
| 5,592,492 A | * | 1/1997 | Ben-Efraim et al. | ........ 714/702 |
| 5,745,497 A | * | 4/1998 | Ben-Efraim et al. | ........ 714/702 |
| 5,928,371 A | * | 7/1999 | Robinson et al. | ........... 714/702 |
| 6,023,565 A | | 2/2000 | Lawman et al. | ................ 716/1 |
| 6,026,220 A | | 2/2000 | Cleereman et al. | ........... 703/23 |
| 6,072,918 A | * | 6/2000 | Sasaki et al. | ................ 382/317 |
| 6,120,549 A | | 9/2000 | Goslin et al. | .................. 703/20 |
| 6,151,690 A | * | 11/2000 | Peeters | ........................ 714/701 |
| 6,173,245 B1 | | 1/2001 | Karchmer et al. | ............ 703/22 |
| 6,216,258 B1 | | 4/2001 | Mohan et al. | ................. 716/17 |
| 6,401,230 B1 | * | 6/2002 | Ahanessians et al. | .......... 716/1 |

OTHER PUBLICATIONS

Draft Developer's Documentation sent to Developers with Sample Code For Testing, Dec. 19, 1997. ("MegaWizard® Plug–In Manager–Megafunction Wizards Information Exchange Requirements").

Press Release from Altera Corporation, Altera's Mega Wizard Plug–Ins Offer the First Too–Independent Parameterized Logic Cores, Feb. 2, 1998.

"A Developers Guide to the Design of MegaWizard® Megafunction Wizards," Documentation for Developers Provided with Final Product Release, Jun. 30, 1998.

"Mega Wizard Plug–Ins," provided on Altera Corporation's World Wide Web Home Page (www.altera.com), prior to Jan. 11, 1999.

"Altera Megafunctions," provided on Altera Corporation's World Wide Web Home Page (www.altera.com), prior to Jan. 11, 1999.

"AMPP Megafunction: Telephone Tone Generation Megafunction," Provided on Altera Corporation's World Wide Web Home Page (www.altera.com), prior to Jan. 11, 1999.

"Introduction to Megafunctions," provided on Altera Corporation's World Wide Web Home Page (www.altera.com), prior to Jan. 11, 1999.

PowerPoint® presentation describing "Megafunction Wizard" functionality made Nov. 1997.

* cited by examiner

Primary Examiner—John F. Niebling
Assistant Examiner—Stacy A Whitmore
(74) Attorney, Agent, or Firm—Beyer Weaver & Thomas, LLP (57) ABSTRACT

Methods and apparatuses are disclosed for creating a parameterized interleaver/de-interleaver megafunction for use in an electronic design, where the interleaver/de-interleaver megafunction requires specific setting of at least one variable parameter value. The method includes presenting a user with the opportunity to specify an adjustable parameter value for at least one interleaver/de-interleaver parameter. The specified parameter value then is received and a suitable interleaver and/or de-interleaver system is generated.

40 Claims, 12 Drawing Sheets

Table 1. Symbol Interleaver/Deinterleaver Wizard Options

| Option | Function | Description |
|---|---|---|
| Number of columns | Block | Specifies the total length of the codeword (i.e., data symbol + checksum symbol). |
| Number of branches | Convolutional | Specifies the number of branches used by the interleaver. |
| Direction | Block Convolutional | Indicates whether you wish to create an interleaver (transmitter) or a deinterleaver (receiver) |
| Memory Type | Block Convolutional | Indicates whether you wish to use internal or external memory. Convolutional interleaving uses synchronous dual-port RAM. Block interleaving uses synchronous single-port RAM. For internal memory, the MegaWizard Plug-In automatically instantiates the most optimum EAB configuration |
| Number of rows | Block | Specifies the maximum number of codewords in the block interleaver/deinterleaver memory. |
| Unit delay element | Convolutional | Specifies the unit delay for each branch of the interleaver/deinterleaver. |
| Symbol Width | Block Convolutional | Specifies the width of the input symbol. |
| Type | Block Convolutional | Indicates whether you wish to create a block or convolutional interleaver/deinterleaver. |

FIG. 3A

Table 2. Symbol Interleaver/Deinterleaver Signals (Part 1 of 2)

| Signal | Function | Memory Type | Description |
|---|---|---|---|
| addr[] | Block | External | Memory address bus. |
| clk | Block Convolutional | Internal External | Input clock signal. |
| clken | Block Convolutional | Internal External | Active-high clock enable. |
| block_full | Block | External | Indicates that a block is full. block_full goes high when the memory block is full. |
| block_empty | Block | External | Indicates that a block is empty. block_empty goes high when the memory block is empty. |
| din[] | Block Convolutional | Internal | Input symbol. |
| next_din | Block | Internal | Input enable. When next_din goes high, the next codeword symbol input is ready to be read. |
| dout[] | Block Convolutional | Internal | Output symbol. |
| dout_valid | Block | Internal | Output enable. When dout_enable goes high, the next codeword symbol output is ready to be read. |
| read_add[] | Block Convolutional | External | Read address bus output. |
| sync_in | Block Convolutional | Internal External | Active-high input resynchronization signal. For convolutional functions, set the branch pointer to branch 0; for block functions, set the branch pointer to column 0, row 0. |
| sync_out | Convolutional | Internal External | Output synchronization signal. The sync_out signal goes high on the first branch of the interleaver. |
| write_add[] | Block Convolutional | External | Write address bus output. |
| write_enable | Block | External | Write enable. The write_enable signal is active high, and should be connected to the write enable of the external RAM. |

| Table 3. Symbol Interleaver/Deinterleaver Performance ||||||||
|---|---|---|---|---|---|---|
| Function | Parameters | Device | Speed Grade | LEs Used | EABs Used | $f_{MAX}$ (MHz) |
| Convolutional interleaver using FLEX 10KE EABs | Depth = 12, Unit Delay = 17, Symbol Width = 8 bits (digital video broadcast settings) | FLEX 10KE | 1 | 392 | 8 | 110 |
| Block interleaver using single-port RAM | Block length = 36, Span delay = 20, Data width = 8, (UTRA) ITU-R RTT | FLEX 10KE | -1 | 40 | 4 | 120 |

FIG. 10

INTERLEAVER-DEINTERLEAVER MEGACORE

CROSS-REFERENCES TO RELATED APPLICATIONS:

The present application claims priority under 35 USC § 119 (e) from U.S. Provisional application Ser. No. 60/187,872, entitled 'INTERLEAVER-DEINTERLEAVER MEGACORE' filed on Mar. 8, 2000, the entire specification of which is incorporated herein by reference.

This invention is related to U.S. Patent. application Ser. No. 09/243,195, filed Feb. 1, 1999, naming Razmik Ahanessians and Marcel A. Leblanc as inventors, and entitled 'METHOD AND APPARATUS FOR GENERATING CUSTOMIZED MEGAFUNCTIONS.' That application is incorporated herein by reference in its entirety and for all purposes.

BACKGROUND OF THE INVENTION

1. Field of the Invention

This invention relates generally to methods, machine readable media and apparatuses for digital systems. In particular, the present invention relates to communication and transmission of digital data and electronic designs relating thereto.

2. Description of Related Art

A programmable logic device (PLD) is a programmable integrated circuit that allows the user of the circuit, using software control, to program particular logic functions the circuit will perform. A wide variety of these devices are manufactured by Altera Corporation. A more complete description of these types of devices and their uses can be found at "www.altera.com" and in various materials published by Altera, but the basic structure and operation of PLDs are well known to those of ordinary skill in the art. Logic functions performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform a particular function or functions required by the user's application. The PLD then can function in a larger system designed by the user just as though dedicated logic chips were employed.

PLDs now are used in a variety of communication and transmission systems involving digital data. Modulation and encoding systems, for example, can be implemented on a PLD and used to process and transmit digital data. Applications that store or transmit digital data require error correction to reduce the effect of spurious noise that can corrupt data. Digital communications systems designers can choose many types of error-correction codes to reduce the effect of errors in transmitted data, including burst errors that arise during transmission of data. Methods, machine readable media and apparatuses permitting relatively simple and full parameterization and optimization of error reduction and correction functions would represent a significant advancement in the art and a significant improvement in the digital system design process.

BRIEF SUMMARY OF THE INVENTION

The present invention provides methods and apparatuses for creating a parameterized interleaver/de-interleaver megafunction for use in an electronic design, where the interleaver/de-interleaver megafunction requires specific setting of at least one variable parameter value. The method includes presenting a user with the opportunity to specify an adjustable parameter value for at least one interleaver/de-interleaver parameter. The specified parameter value then is received and a suitable interleaver and/or de-interleaver system is generated. Further details and advantages of the invention are provided in the following Detailed Description and the associated figures.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which:

FIG. 5A1 is an illustration of a window presented to a user via a graphical user interface in accordance with one embodiment of this invention.

FIG. 5A2 is an illustration of a window presented to a user via a graphical user interface in accordance with one embodiment of this invention.

FIG. 5A3 is an illustration of a window presented to a user via a graphical user interface in accordance with one embodiment of this invention.

FIG. 5A4 is an illustration of a window presented to a user via a graphical user interface in accordance with one embodiment of this invention.

FIG. 5B1 is an illustration of a window presented to a user via a graphical user interface in accordance with one embodiment of this invention.

FIG. 5B2 is an illustration of a window presented to a user via a graphical user interface in accordance with one embodiment of this invention.

FIG. 5B3 is an illustration of a window presented to a user via a graphical user interface in accordance with one embodiment of this invention.

FIG. 5B4 is an illustration of a window presented to a user via a graphical user interface in accordance with one embodiment of this invention.

DETAILED DESCRIPTION OF THE INVENTION

The following detailed description of the invention will be with reference to one or more preferred embodiments of the invention, but is not limited to such embodiments. The detailed description is intended only to be illustrative. Those skilled in the art will readily appreciate that the detailed description given herein with respect to the FIGURES is provided for explanatory purposes as the invention extends beyond these limited embodiments. For example, the present invention is described in connection with a variety of exemplary interleaver/de-interleaver variable parameters. However, the present invention may incorporate and use other parameters and variable values in parameterizing and optimizing an interleaver and/or de-interleaver function(s).

The present invention provides methods and apparatuses for creating a parameterized and optimized interleaver/de-interleaver megafunction for use in an electronic design, where the interleaver/de-interleaver megafunction requires specific setting of at least one variable parameter value. The method includes presenting a user with the opportunity to specify an adjustable parameter value for at least one interleaver/de-interleaver parameter. The specified parameter value then is received and a suitable interleaver and/or de-interleaver system is generated.

Interleaving is the process of reordering the symbols in a group of transmitted codewords such that adjacent symbols in the data stream are not from the same codeword. The receiver reassembles the codewords when it processes the data stream. The interleaving process helps reduce the effects of burst errors in the transmitted data streams (that is, multiple errors in a row), because rearranging the codeword symbols spreads the errors among multiple codewords.

Interleaving is a standard digital signal processing function used in many communications systems. Applications that store or transmit digital data require error correction to reduce the effect of spurious noise that can corrupt data. Digital communications systems designers can choose many types of error-correction codes to reduce the effect of errors in stored or transmitted data. For example, Reed-Solomon encoders/decoders, which are block-encoding algorithms, are used frequently to perform forward error correction (FEC).

Symbol interleaver/de-interleaver systems can mitigate the effects of burst noise. Typically, these functions are needed for transport channels that require a bit error ratio (BER) on the order of $10^{(-6)}$. Interleaving improves the efficiency of Reed-Solomon encoders/decoders by spreading burst errors across several Reed-Solomon codewords.

Depending on a user's application, any one of a variety of interleaving/de-interleaving algorithms can be used. Some of these algorithms might include convoluational, block, continuous block, heliocoidal and random interleaving schemes. Interleaving also can be performed at the bit level, as with turbo encoding systems such as the one developed by Altera Corporation of San Jose, Calif. Finally, multiple interleaving algorithms and/or levels can be applied to create more complex interleaving schemes.

Two of the most commonly used algorithms are convolutional and block interleaver/de-interleaver systems which can be implemented. Convolutional interleaver/de-interleaver functions process data in a continuous stream, which makes them desirable for use in high-speed applications that require correction for burst errors (for example, digital video broadcasting). Typically, these functions are used with Reed-Solomon functions.

Block interleaver/de-interleaver systems process data in a discrete stream and are desirable for use in applications such as GSM (that is, mobile phones). These functions are often used with Reed-Solomon functions or Turbo Code encoders/decoders. Compared to block systems, convolutional interleaver/de-interleaver systems provide reduced delay and lower memory usage for the same distribution of errors.

Electronic design automation (EDA) is becoming increasingly complicated and time consuming, due in part to the greatly increasing size and complexity of the electronic devices designed by EDA tools. Such devices include general purpose microprocessors as well as custom logic devices including programmable logic devices. The design of even the simplest of these devices typically involves generation of a high level design, logic simulation, generation of a network, timing simulation, etc.

With the density of PLDs reaching an ever larger number of gates, it is now possible to implement entire digital subsystems on a single PLD, including error correction and reduction functions. However, higher density levels pose new challenges, especially with respect to designing such systems and devices. Designers must create state of the art circuitry while meeting the demands of shrinking development cycles. Improvements have been made which allow designers to implement large, complex digital systems, which is particularly important for designers who want to use high-density PLDs, but who are faced with increasingly stringent and shorter time-to-market demands.

Predicting, constructing and implementing optimal interleaver/de-interleaver systems is a particularly time consuming aspect of many transmission and other data systems. While a user will know the codeword length to be used in the system and will have an estimate of the expected burst error lengths that will be encountered, considerable work would nevertheless have to be done to optimize a system's spreading of the estimated burst errors and to optimize any error correction configuration such as a Reed-Solomon FEC system.

Figure 1:
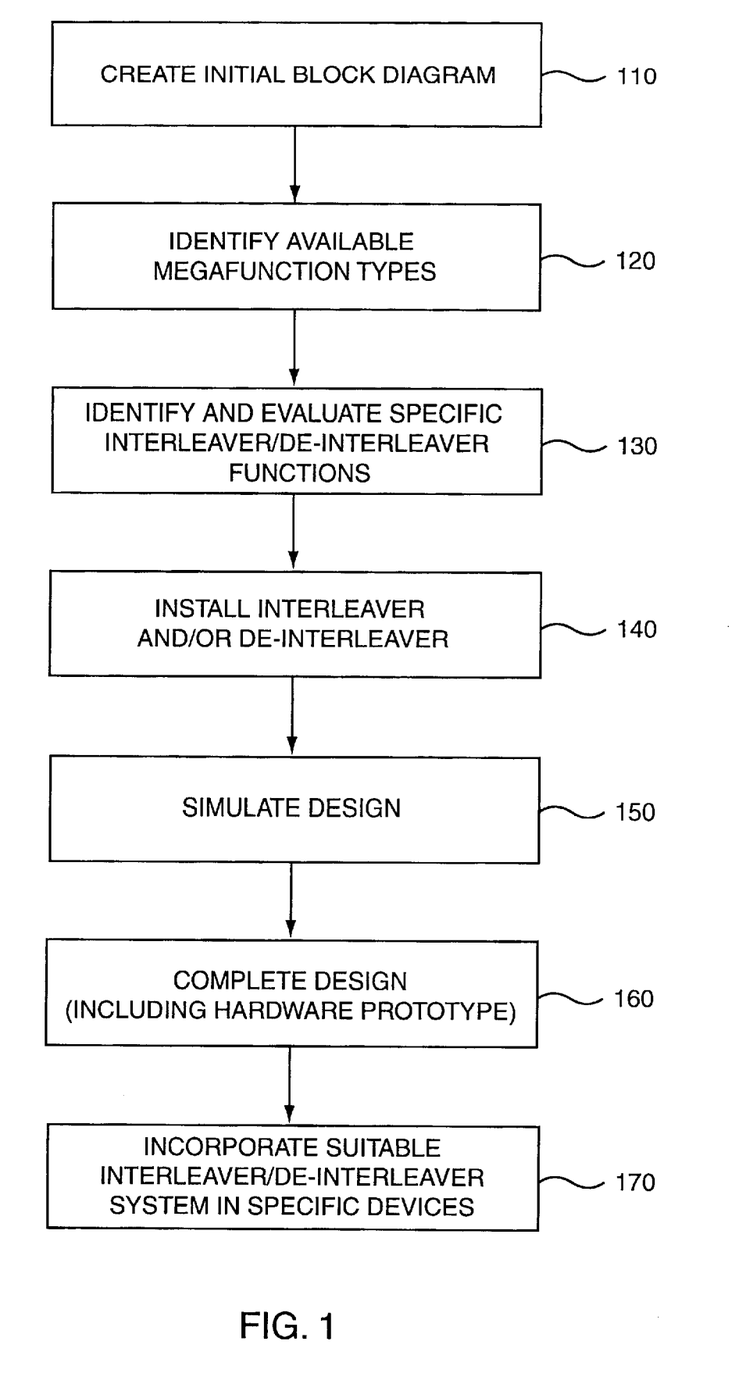
FIG. 1 is a flow diagram of a design process in which an interleaver/de-interleaver system is being incorporated using one embodiment of the present invention.

A typical design cycle incorporating the present invention (using, for example, Altera's OpenCore technology) is shown in FIG. 1. A designer creates an initial block diagram 110 and subsequently identifies any megafunctions available for use in the anticipated system 120. The designer then can identify and evaluate one or more specific interleaver and/or de-interleaver functions 130 with regard to functionality and the range of parameterization available. Moreover, as described in more detail below, using the present invention, the designer can optimize such functions based on the projected burst error distribution data yielded by the plugin. After determining the most appropriate interleaver and/or de-interleaver function(s), the designer then can install the interleaver and/or de-interleaver function(s) 140 and simulate performance 150 within the anticipated circuitry and system.

In many applications, in order to fully validate and complete the system's design, as called for in step 160, it frequently is necessary to operate the system on a hardware prototype platform. Once this prototype validation is completed, the design (including any interleaver and/or de-interleaver function(s) used) can be incorporated into specific devices 170 and be put into use.

Figure 2:
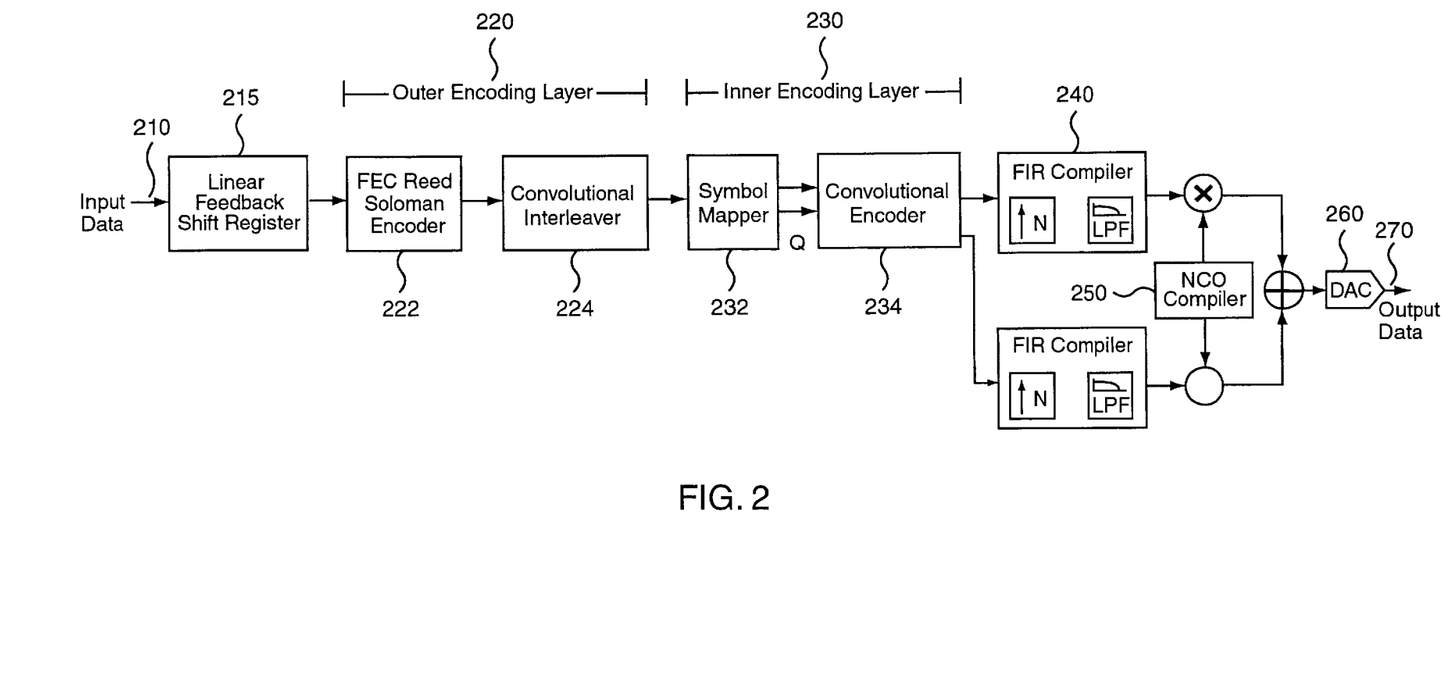
FIG. 2 is a block diagram of a typical modulator utilizing an interleaver designed using one embodiment of the present invention.

Use of customized megafunctions in systems (for example, Altera's OpenCore system) allows a designer to easily implement DSP functions and focus time and effort on custom logic. FIG. 2 is an example of a typical modulator that can be designed using the present invention. Original data is input at 210 to a linear feedback shift register 215. The output of register 215 is fed to an outer encoding layer 220, which includes an FEC Reed Solomon encoder 222 and a convolutional interleaver 224. The output of the outer encoding layer 220 is fed to the inner encoding layer 230, which includes a symbol mapper 232 and a convolutional encoder 234. The output of inner coding layer 230 is sent to an FIR compiler array 240. The data from array 240 is fed to an NCO compiler 250, sent to a digital to analog coding step 260 and finally transmitted 270.

Figure 3:
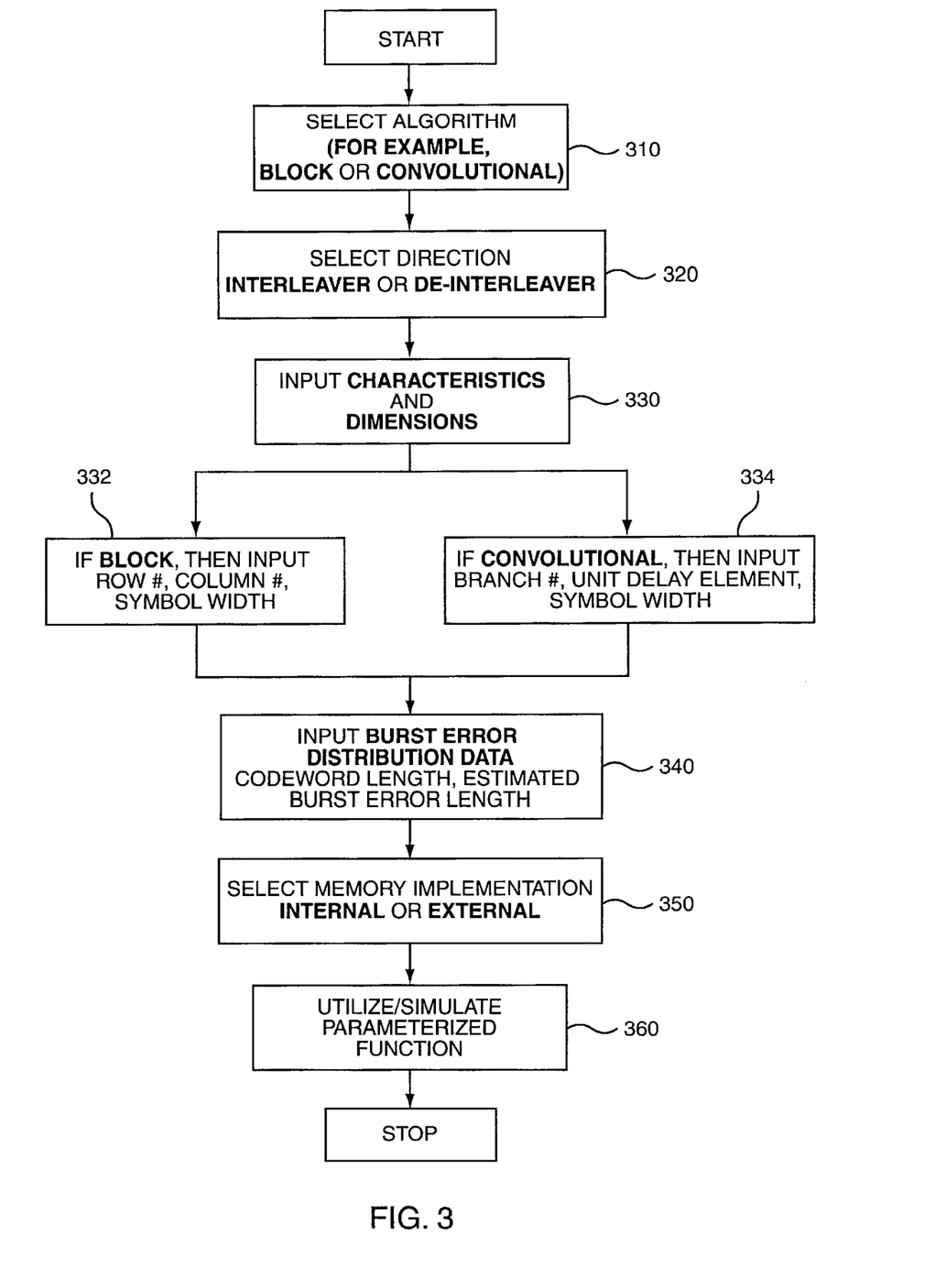
FIG. 3 is a flow diagram of one method of the present invention in which various parameters are selected by a user to design an interleaver/de-interleaver system.
Figure 3A:
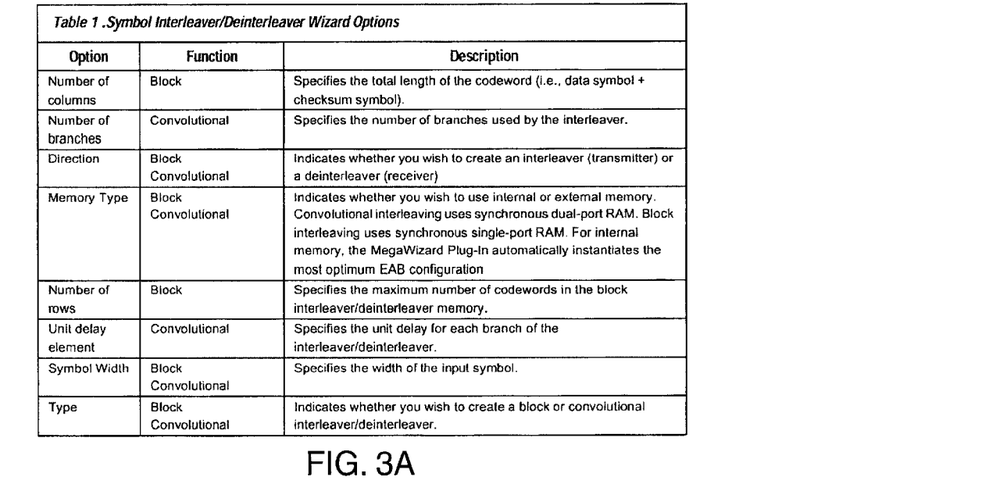
FIG. 3A is a table showing the various parameter options available using one embodiment of the present invention.
Figure 3B:
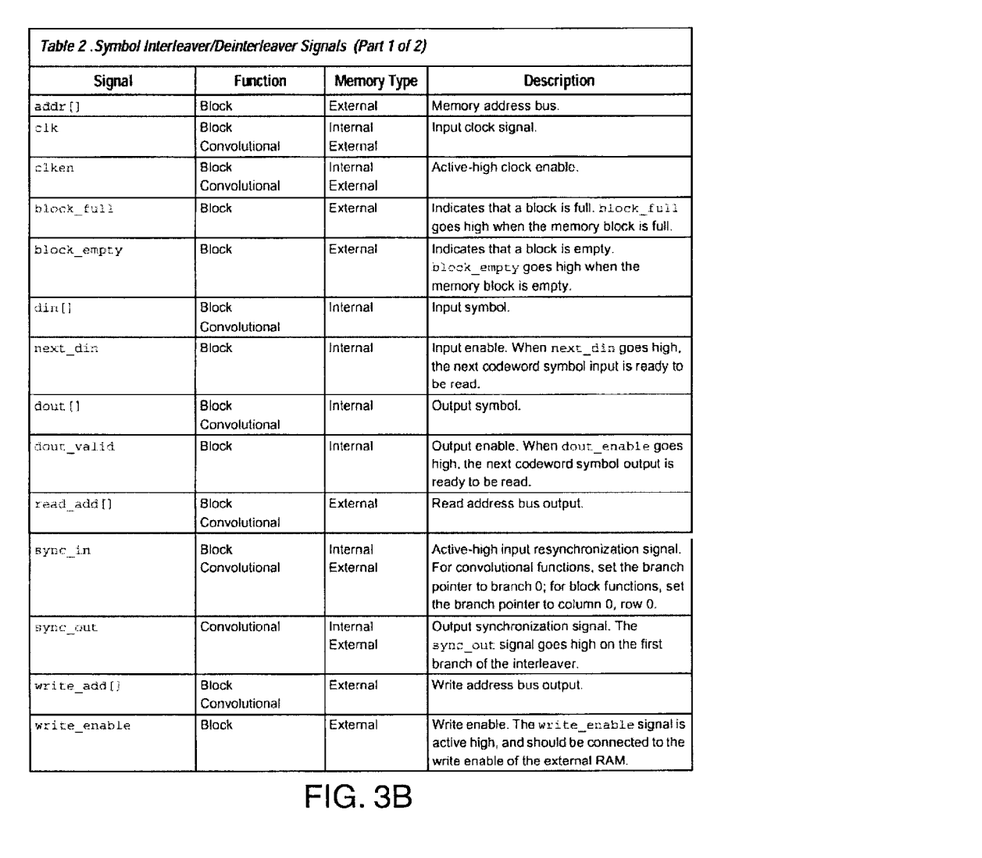
FIG. 3B is a table showing a variety of signals that can be used in designing one or more interleaver/de-interleaver systems using the present invention.
Figure 4:
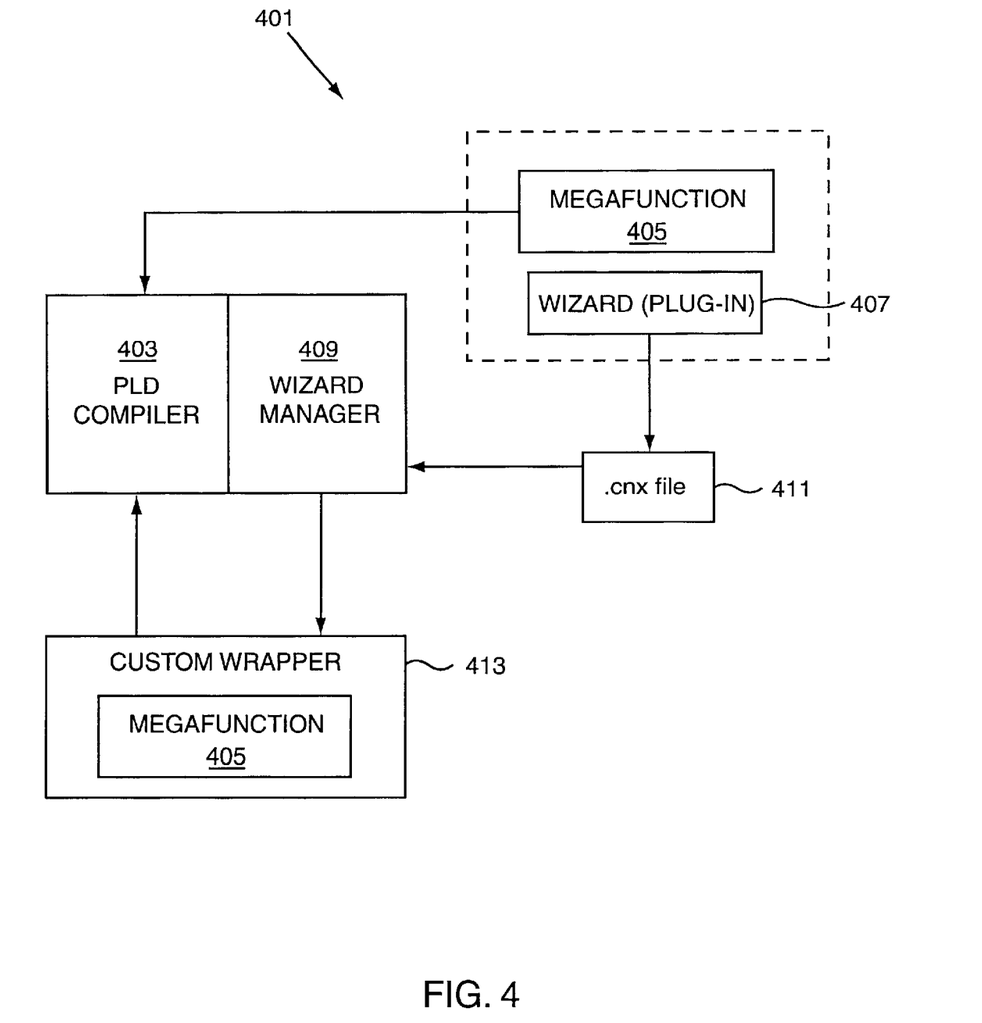
FIG. 4 is a block diagram of a system including a plug-in, a plug-in manager and a compiler.

One method of generating a suitable interleaver/de-interleaver system uses a series of decisions by the designer to create and evaluate a potential system. FIG. 3 illustrates one example of such a methodology as a flowchart with certain parameter values available for selection. The term "parameter value" as used herein is not to be interpreted as being limited solely to numerical values: For example, the selection of a BLOCK or CONVOLUTIONAL interleaver algorithm is the selection of a "parameter value" within the scope of this invention. Some examples of the options available to a user are illustrated in table form in FIG. 3A. Depending upon the specific parameter values and system characteristics chosen by a user, a system may have a variety of signals, some examples of which are shown in table format in FIG. 3B. FIG. 4 presents a system 401 for using a plug-in and associated wizard interface in connection with one embodiment of this invention. As shown, system 401 includes an EDA environment 403 including a compiler that compiles user designs using Hardware Description Language schematic blocks, timing constraints, floor plans, etc. EDA environment 403 may make use of megafunctions such as an interleaver/de-interleaver system megafunction 405 during compilation of a user's design. For this to occur, the user must some how specify that megafunction 405 is integrated in his or her design.

Accordingly, interleaver/de-interleaver system megafunction 405 is associated with a wizard plug-in 407 that presents the user/developer with various options for assigning values toy pertinent parameters or otherwise constraining the functioning of megafunction 405. As noted above, a plug-in such as interleaver/de-interleaver system plug-in 407 may present a graphical user interface such as window 505 depicted in FIG. 5. Plug-in 407 plugs into a plug-in manager 409. Manager 409 is able to launch the wizard associated with plug-in 407 when a user/developer makes use of the interleaver/de-interleaver system megafunction 405. It may accomplish this by locating the appropriate plug-in for the selected interleaver/de-interleaver system megafunction in the user's file system.

During operation, the wizard associated with plug-in 407 presents the user/developer with various options for constraining and/or parameterizing megafunction 405. The user's selections are saved during the process and packaged in a "parameter file" 411 (denoted by the extension ".cnx" in this example) when the user finishes the process. File 411 may include parameter information, custom symbol information, connection information, and the like. The custom symbol information may specify the appearance of the symbol for a schematic editor used by environment 403. Note that many design environments allow users to edit their designs with a schematic editing tool operating on a schematic depiction of the design in progress. The custom symbol information for the interleaver/de-interleaver system shown in FIG. 5 may include symbol 511. The connection information in parameter file 411 specifies the user-selected types of connections to various ports of megafunction 405. For example, file 411 may specify that a port A of megafunction 405 is connected to a bus Z and that a port B of megafunction 405 is set to a particular constant value signal.

Parameter file 411 is provided to plug-in manager 409, which takes that information and creates a "custom variation file" 413 associated with megafunction 405. Essentially, custom variation file 413 is a top-level design file that may be viewed as enveloping megafunction 405. Custom variation file 413 houses (typically in HDL format) all the parameters that the user selected with the graphical user interface with the wizard. From the perspective of design environment 403, file 413 appears to be a non-parameterized function that it can handle with ease.

Note that in this example plug-in manager 409 is tightly integrated with EDA environment 403. This need not be the case, however, as manager 409 may be provided as a separate "stand-alone" application design to run in conjunction with a particular design environment.

Figure 5A:
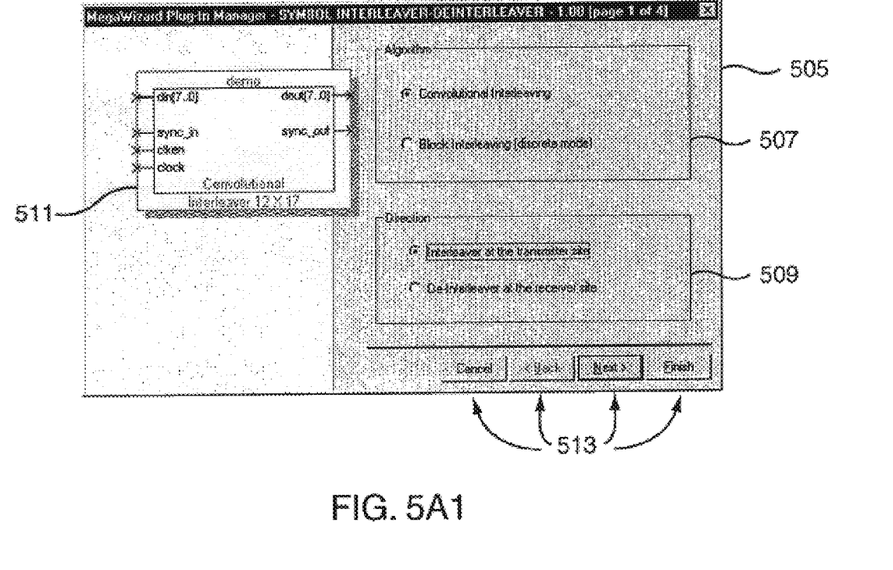

FIGS. 5A1–5A4 (showing creation of a convolutional interleaver) and FIGS. 5B1–5B4 (showing creation of a block de-interleaver) illustrate implementation of some of the methodologies of the present invention as presented to a user using a plug-in wizard configuration. The interleaver/de-interleaver system plug-in can provide a wizard that prompts the user/developer to specify particular values for parameters that may be used by the megafunction. A wizard is generally any software that assists a user in completing a task such as filling out a form or template. Here, the wizard presents the user with options for customizing an interleaver/de-interleaver system. A well-designed wizard presents the options to the user in a logical order and in pertinent, easy to understand terms.

As shown in FIG. 5A1, a user's computer display will present a window 505 during use of the plug-in. In this case, the user would have already selected and launched the interleaver/deinterleaver system plug-in and thereby initiates the wizard functionality. That functionality is manifested by one or more windows that give the user/developer the option of setting certain parameters associated with the interleaver/de-interleaver system megafunction.

Figure 5A:
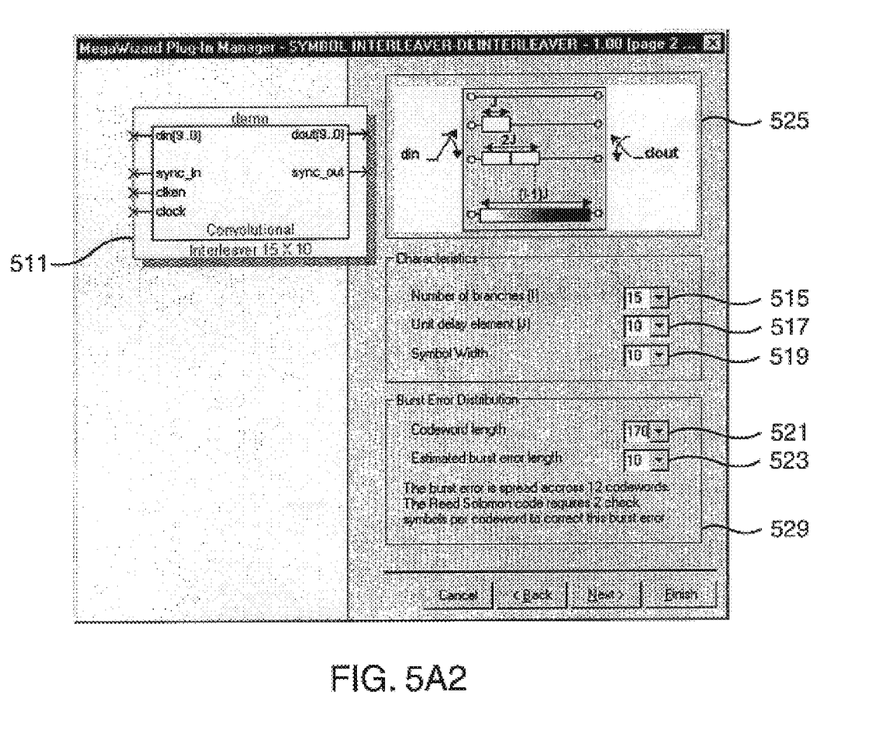
Figure 5A:
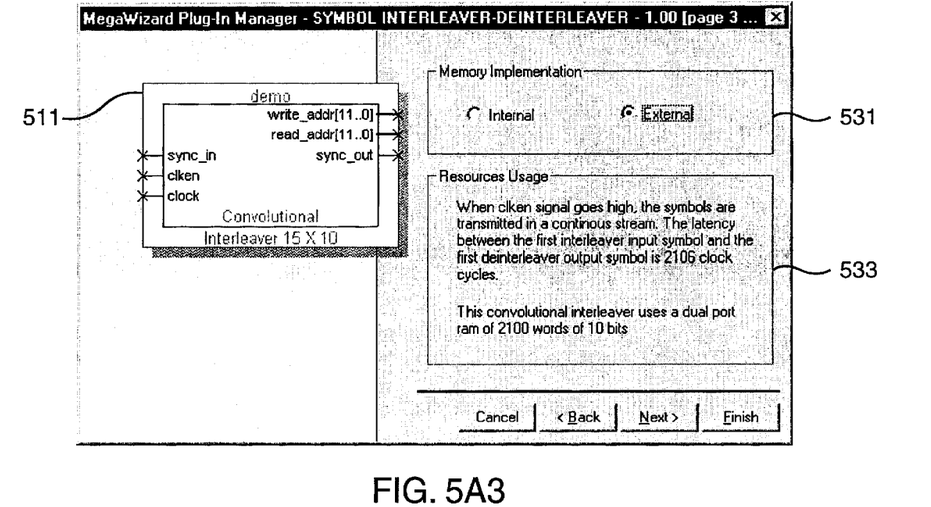
Figure 5A:
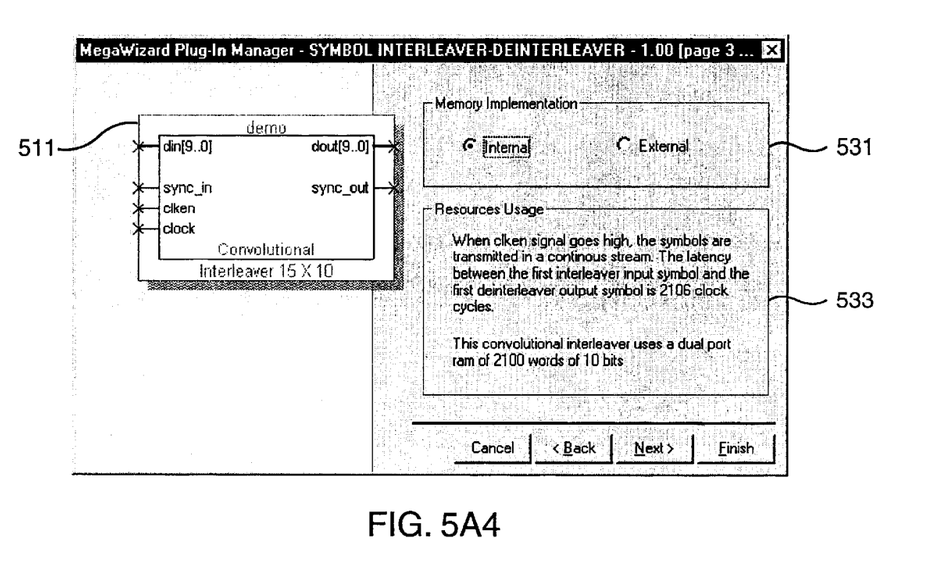

In this case, that window 505 can give the user/developer the option of choosing one of two or more options by various means, such as a radio button block 507 or 509 (allowing the user to click, and thereby select one of several options), or one or more pull-down menus 515, 517, 519, 521 and 523 which allow the user to specify quantifiable selections, as seen in FIG. 5A2. Further, window 505 can include a symbol representation 511 that presents the parameterized megafunction in a schematic or graphical form depicting the user selected parameter values.

Finally, each window 505 can include a series of buttons 513. These buttons 513 allow the user/developer to cancel the process, move to a previous page of the wizard, move to a next page of the wizard, and complete the use of the wizard. As illustrated in the examples discussed below, it may be convenient in some cases to present the wizard options in multiple pages (separate control windows). To move between these various pages of the wizard, the user simply clicks on the "back" or "next" buttons. When the user is satisfied with his or her selections for the interleaver/de-interleaver system megafunction, he or she selects the "finish" button. This causes the plug-in to package the user's settings and provide them to a plug-in manager that further processes the user selections and makes them available to a compiler.

Figure 5B:
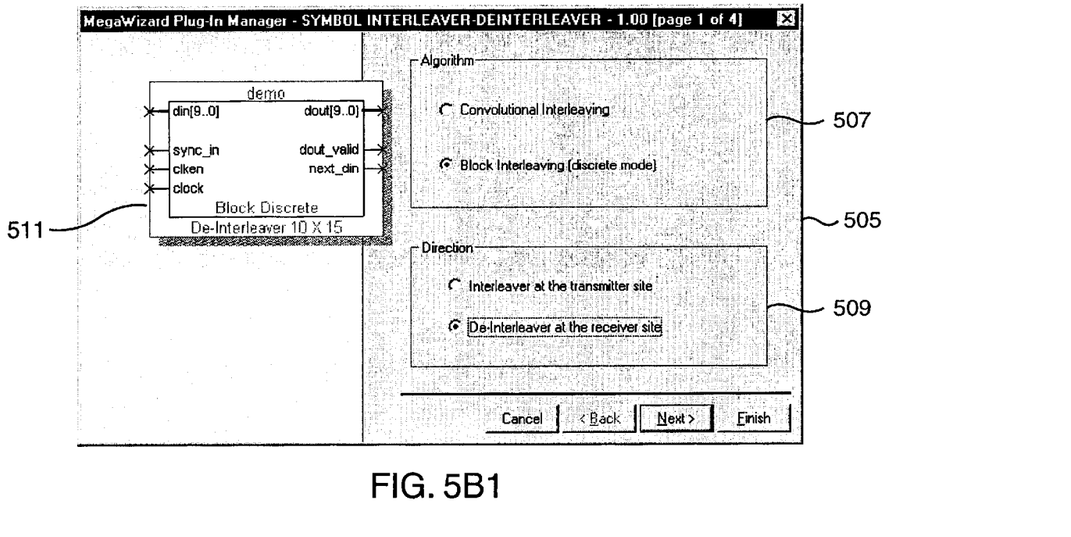
Figure 6:
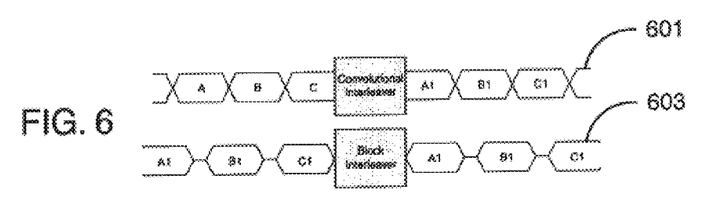
FIG. 6 is a graphical comparison of the data streaming performed by a convolutional interleaver and a block interleaver.

A user starts the process 301 and is prompted to select an algorithm 310, either convolutional or block, which can be clicked on in box 507 in FIGS. 5A1 and 5B1. As noted above, the choice of block or convolutional interleaving or de-interleaving can be based on a number of factors. A user may select the algorithm that best suits the user's need. One of the benefits of the present invention is highlighted in a situation where the user is not sure or does not know which algorithm will work best. The present invention provides a quick and inexpensive means for evaluating both operational algorithms to determine which will provide the optimal operational characteristics. FIG. 6 illustrates and compares the data streaming performed by a convolutional interleaver 601 and a block interleaver 603.

Figure 7:
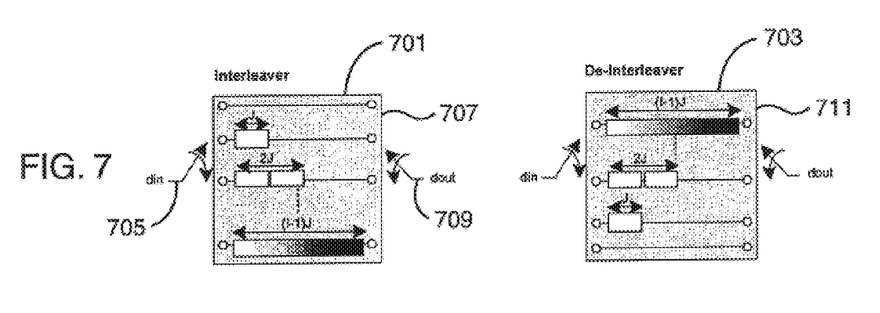
FIG. 7 is a schematic diagram of a convolutional interleaver/de-interleaver system.

More particularly, FIG. 7 schematically shows a convolutional interleaver 701 and a convolutional de-interleaver 703. The number of branches I is called the depth of the interleaver. The first branch 707 has no delay. Each consecutive branch introduces an additional symbol delay J. Each symbol contains a variable number of bits that the user can modify through the wizard plug-in, The commutator 705 connects to each branch in order, for every symbol. Therefore, when a symbol enters a branch of the interleaver, it leaves the branch via the output commutator 709 after a variable delay that depends on the branch index.

For the de-interleaver 703 the delays introduced at each branch are complementary to the interleaver 701. That is, once a symbol enters a branch of the de-interleaver 703, it leaves the branch via the output commutator 711 after a variable delay that depends on the branch index. With this interleaving structure, every symbol incurs a fixed delay through the combination of the interleaver and de-interleaver. For synchronization purposes, the sync bytes and inverted sync bytes must be routed to the first branch 707 of the interleaver 701, which corresponds to a null delay. In principle, the de-interleaver 703 is similar to the interleaver 701, but the branch indexes are reversed (that is, de-interleaver branch 711 incurs the largest delay). The deinterleaver synchronization can be performed by routing the first recognized sync byte in branch 711.

The interleaving/de-interleaving process introduces a constant delay between the interleaver input data and the de-interleaver output data. The delay is calculated using the following equation:

$$(\text{depth} \cdot \text{symbol delay} \cdot (\text{depth}-1))+6$$

The symbol throughput is equal to the frequency of the function.

Figure 10:
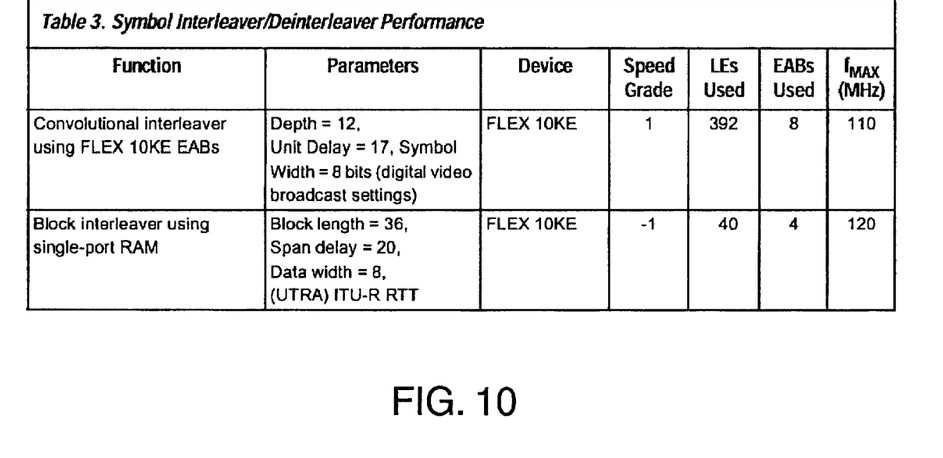
FIG. 10 is a table showing examples of resource usage and speeds for certain embodiments of the present invention.

Knowing this delay, a user can design an application to operate on a continuous stream of codewords. To support continuous streaming, the user may use dual-port memory to implement a convolutional interleaver/de-interleaver function. FIG. 10 illustrates one example of the resource usage and speed of the convolutional function (as calculated using Altera's MAX-PLUS Interleaver version 9.2 software and Altera's FLEX 10KE device).

Figure 8:
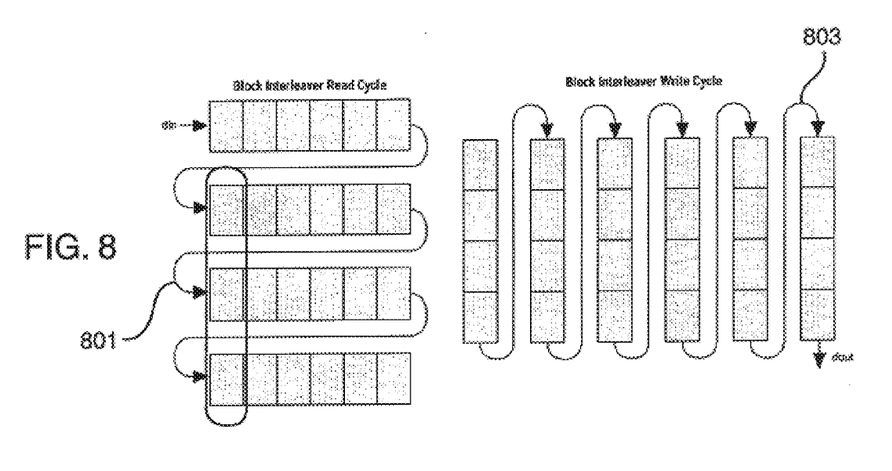
FIG. 8 is a schematic diagram of a block interleaver's read and write cycles.

FIG. 8 illustrates block function operation using a 6-symbol codeword. The block interleaver/de-interleaver can use single-port SRAM memory configured as a matrix of I rows by J columns to perform interleaving. During the write cycle 803, the input symbols are written column by column; during a read cycle 801, the output symbols are read row by row. The column length is usually equal to the codeword length of the FEC encoder, while the number of rows (often called the span) is the interleaver delay.

The block interleaver/de-interleaver operates in discrete mode and can use a single-port memory as a buffer. The symbol transmission consists of an alternating sequence of write and read cycles. Each cycle delay is equal to the buffer size, which is the block length multiplied by the span delay. The total cumulative delay from the transmitter to the receiver can be calculated using the following equation:

$$2 \cdot \text{Number of Rows} \cdot (\text{Number of Columns}+4)$$

Once an algorithm is selected, the direction of the system then can be chosen at 320, to which again can be a selection box 509 having choices to click on in the wizard of FIGS. 5A1 and 5B1. Again, the present invention makes evaluation of several possible modes of operation relatively easy. Also, as will be apparent to one of ordinary skill in the art, a user generally should use the same interleaving algorithm for both the transmitter and receiver. Therefore, selection of an interleaver's characteristics similarly establishes the characteristics of the complementary de-interleaver that would be used in a given transmission system. However, as a result of the ability to select the direction of the system, a user can evaluate the performance of a given interleaver within a potential transmitter, and likewise can evaluate the performance of a given de-interleaver within a potential receiver. It also should be noted that the selection of the system direction 320 can be made prior to selecting the algorithm 310. As seen in the Figures, the selection of given combinations of algorithm and direction can be reflected in the graphical display 511 of a block diagram by the wizard, which can show other relevant information relating to the proposed design (for example, input and output signals and connections).

Once the algorithm and direction have been chosen and set, a user can input the specific characteristics and dimensions of the system under consideration at step 330. As with the selection of the algorithm and direction, setting the characteristics and dimensions of a system can be presented graphically to the user by the wizard. At step 332 of FIG. 3, when a convolutional interleaver or de-interleaver is under consideration, the wizard can prompt a user to input the number of branches, unit delay element and symbol width (illustrated, for example, in pull-down menus 515, 517 and 519 of FIG. 5A2). As seen in FIG. 5A2, when a convolutional interleaver or de-interleaver is selected, the wizard also can provide a graphical depiction 525 of the algorithm being used, showing $d_{in}$ and $d_{out}$ and the delay characteristics of the transmission system.

Figure 5B:
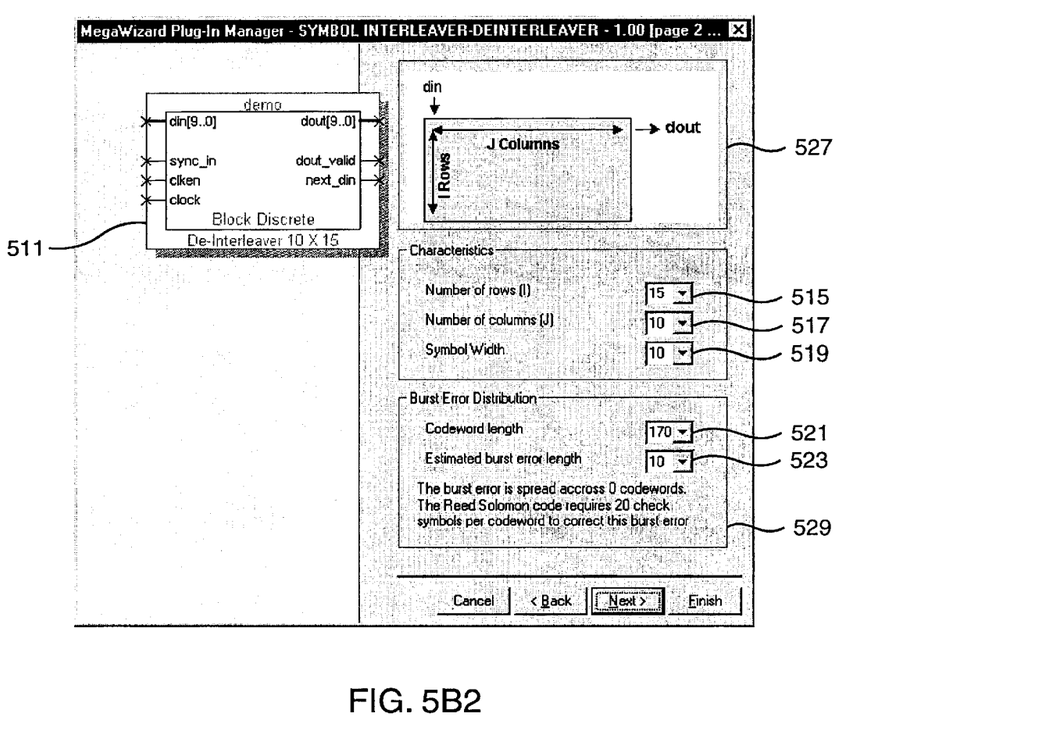
Figure 5B:
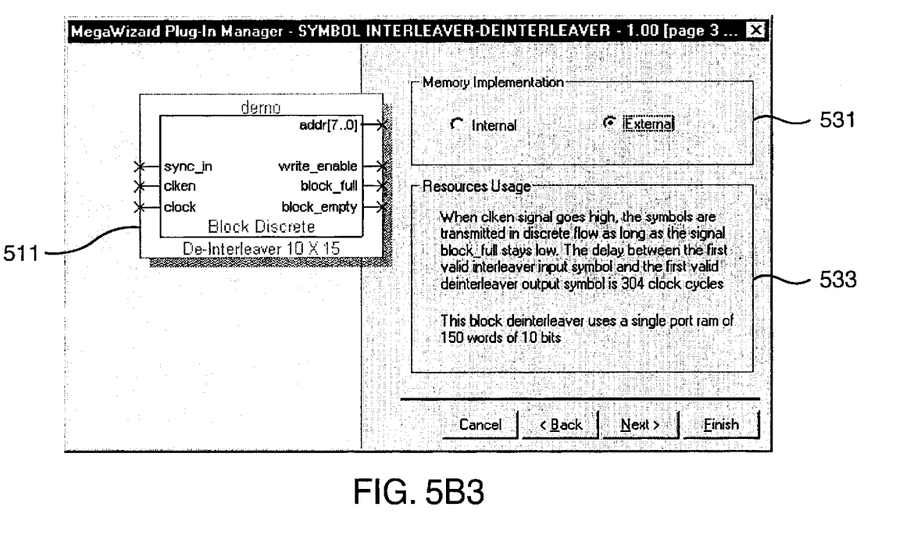
Figure 5B:
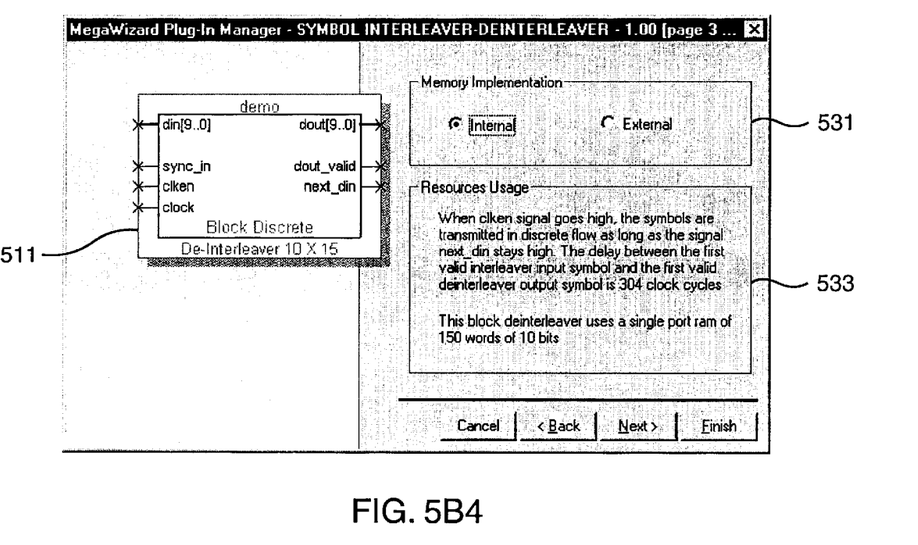

Conversely, at step 334 of FIG. 3, if a block interleaver or de-interleaver is being evaluated, then the number of rows, number of columns and symbol width will be input in a manner (illustrated, for example, at pull-down menus 515, 517 and 519 in FIG. 5B2). Typically, the Reed-Solomon codeword length is the number of columns and the number of rows is the number of codewords to interleave. Again, like the convolutional interleaver/de-interleaver system depiction by the wizard, the wizard can provide a graphical display 527 of the block interleaver/de-interleaver system.

Once this dimensional and characteristic information is entered, the codeword length and estimated burst error length can be input at step 340 (and as seen in pull-down menus 521 and 523 in the example illustrated in FIGS. 5A2 and 5B2) to assist the user in performing burst error analysis. In the wizard examples shown in FIGS. 5A2 and 5B2, the characteristics and burst error distribution information also can be typed in. In this embodiment, the wizard displays in a Burst Error Distribution box 529 the number of codewords the burst error is spread across before interleaving and indicates the number of Reed-Solomon check symbols that will be required to correct the error. In one embodiment of the invention, the calculations involving burst error analysis assume that two Reed-Solomon check symbols are required to fix one symbol error per codeword.

Finally, the user can designate at step 350 of FIG. 3 whether the interleaver/de-interleaver system will use internal or external memory resources. Again, this selection can be depicted by the wizard, as seen in the Memory Implementation box 531 of FIGS. 5A3, 5A4, 5B3 and 5B4. The wizard can then provide information on resource usage, such as that shown in the Resources Usage box 533 and graphical display 511. Once the user finds a system that possesses the necessary attributes for use in the anticipated transmission system, the user may instantiate the megafunction variation into a design and utilize and/or simulate the fully parameterized and optimized function in a circuit, at step 360 of FIG. 3.

Figure 9A:
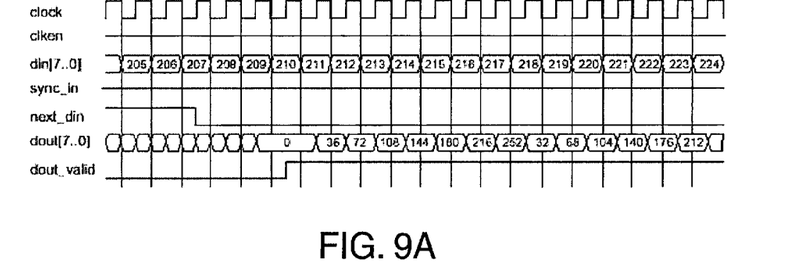
FIG. 9A is an example of a graphical waveform produced from a simulator using vector files generated by one embodiment of the present invention.
Figure 9B:
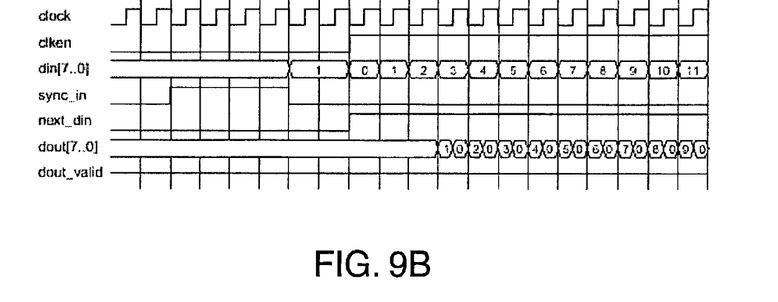
FIG. 9B is an example of a graphical waveform produced from a simulator using vector files generated by one embodiment of the present invention.
Figure 9C:
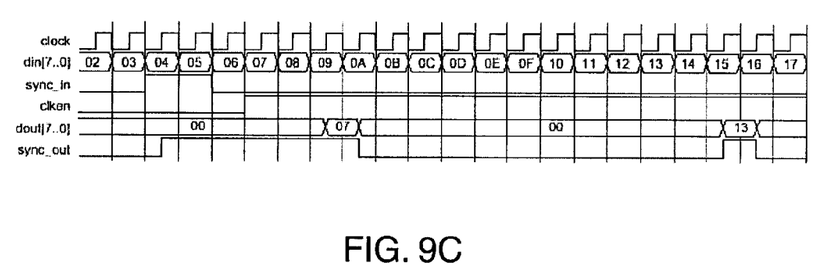
FIG. 9C is an example of a graphical waveform produced from a simulator using vector files generated by one embodiment of the present invention.

Once a custom interleaver/de-interleaver system is created and finalized, a user can 15 simulate the system with on the fly simulation vector files generated by the wizard for both the interleaver and de-interleaver. After compiling the design, the user can simulate the core in the system with these vector files to view the functionality and timing of the system. A simulator can convert the vector files generated by the wizard into graphical waveforms. FIGS. 9A and 9B show examples of such waveforms for a block interleaver read cycle and a block de-interleaver write cycle, respectively. An example of a waveform from a convolutional interleaver is shown As can be seen from the foregoing discussion, there are numerous parameter variables that can be used create a customized and parameterized interleaver/de-interleaver system. Such parameterized systems will allow designers to test and evaluate various interleaver/de-interleaver configurations more quickly and less expensively than has previously been possible.

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation as illustrated and described. Hence, all suitable modifications and equivalents are deemed to fall within the scope of the invention.

We claim:

1. A method of electronic design, the method comprising:
   presenting a user with the opportunity to specify a variable parameter value;
   receiving a user specified parameter value;
   implementing the user specified parameter value to create the parameterized interleaver/de-interleaver megafunction.

2. The method of claim 1 wherein the variable parameter value is an interleaver/de-interleaver algorithm.

3. The method of claim 1 wherein the variable parameter value is the direction of the megafunction.

4. The method of claim 1 wherein the variable parameter value comprises a characteristic dimension of a convolutional interleaver/de-interleaver system.

5. The method of claim 1 wherein the variable parameter value comprises a characteristic dimension of a block interleaver/de-interleaver system.

6. The method of claim 1 wherein the variable parameter value comprises a burst error value.

7. The method of claim 1 wherein the variable parameter value comprises memory usage.

8. The method of claim 1 further comprising presenting the user with a parameterized megafunction incorporating the user specified parameter value.

9. The method of claim 1 further comprising compiling an electronic design including instructions specifying the parameterized interleaver/de-interleaver megafunction to produce instructions for producing an integrated circuit having the paramterized interleaver/de-interleaver megafunction incorporated therein.

10. The method of claim 1 further comprising:
    calculating a burst error distribution based upon the value received from the user input; and
    presenting the user with the calculated burst error distribution.

11. The method of claim 1, wherein a graphical user interface presents the user with the opportunity to specify the adjustable value.

12. A hardware device comprising the parameterized interleaver/de-interleaver megafunction of claim 1.

13. A method of creating a parameterized interleaver/de-interleaver megafunction for use in an electronic design, the interleaver/de-interleaver megafunction requiring specific setting of a plurality of variable parameter values, the method comprising:
    presenting a user with the opportunity to specify the following variable parameter values:
       an interleaver/de-interleaver system algorithm;
       dimensions and characteristics for the specified interleaver/de-interleaver system algorithm;
       burst error distribution information;
    receiving the parameter values specified by the user;
    implementing the specified parameter values into a megafunction.

14. The method of claim 13, wherein a graphical user interface presents the user with the opportunity to specify the adjustable value.

15. The method of claim 13 wherein the specified dimensions and characteristics are the number of rows, the number of columns and the symbol width for a block interleaver/de-interleaver system.

16. The method of claim 13 wherein the specified dimensions and characteristics are the number of branches, the unit delay element and the symbol width for a convolutional interleaver/de-interleaver system.

17. A computer program product use in an electronic design, the computer program product comprising:
    computer code for presenting a user with the opportunity to specify a variable parameter value;
    computer code for receiving a user specified parameter value;
    computer code for implementing the user specified parameter value to create the parameterized interleaver/de-interleaver megafunction.

18. The computer program product of claim 17 wherein the variable parameter value is an interleaver/de-interleaver algorithm.

19. The computer program product of claim 17 wherein the variable parameter value is the direction of the megafunction.

20. The computer program product of claim 17 wherein the variable parameter value comprises a characteristic dimension of a convolutional interleaver/de-interleaver system.

21. The computer program product of claim 17 wherein the variable parameter value comprises a characteristic dimension of a block interleaver/de-interleaver system.

22. The computer program product of claim 17 wherein the variable parameter value comprises a burst error value.

23. The computer program product of claim 17 wherein the variable parameter value comprises memory usage.

24. The computer program product of claim 17 further comprising computer code for presenting the user with a parameterized megafunction incorporating the user specified parameter value.

25. The computer program product of claim 17 further comprising computer code for compiling an electronic design including instructions specifying the parameterized interleaver/de-interleaver megafunction to produce instructions for producing an integrated circuit having the paramterized interleaver/de-interleaver megafunction incorporated therein.

26. The computer program product of claim 17 further comprising:

computer code for calculating a burst error distribution based upon the value received from the user input; and computer code for presenting the user with the calculated burst error distribution.

27. The computer program product of claim 17 wherein a graphical user interface presents the user with the opportunity to specify the adjustable value.

28. A hardware device comprising the computer program product of claim 17.

29. A product comprising a machine usable medium on which is provided instructions comprising:

presenting a user with the opportunity to specify a variable parameter value;

receiving a user specified parameter value;

implementing the user specified parameter value to create the parameterized interleaver/de-interleaver megafunction.

30. The product of claim 29 wherein the variable parameter value is an interleaver/deinterleaver algorithm.

31. The product of claim 29 wherein the variable parameter value is the direction of the megafunction.

32. The product of claim 29 wherein the variable parameter value comprises a characteristic dimension of a convolutional interleaver/de-interleaver system.

33. The product of claim 29 wherein the variable parameter value comprises a characteristic dimension of a block interleaver/de-interleaver system.

34. The product of claim 29 wherein the variable parameter value comprises a burst error value.

35. The product of claim 29 wherein the variable parameter value comprises memory usage.

36. The product of claim 29 further comprising the machine usable medium on which is provided instructions comprising presenting the user with a parameterized megafunction incorporating the user specified parameter value.

37. The product of claim 29 further comprising the machine usable medium on which is provided instructions comprising compiling an electronic design including instructions specifying the parameterized interleaver/de-interleaver megafunction to produce instructions for producing an integrated circuit having the paramterized interleaver/de-interleaver megafunction incorporated therein.

38. The product of claim 29 further comprising the machine usable medium on which is provided instructions comprising:

calculating a burst error distribution based upon the value received from the user input; and presenting the user with the calculated burst error distribution.

39. The product of claim 29, wherein a graphical user interface presents the user with the opportunity to specify the adjustable value.

40. A hardware device comprising the product of claim 29.

* * * * *